United States Patent
Tan

(10) Patent No.: US 10,490,129 B2
(45) Date of Patent: Nov. 26, 2019

(54) AMOLED DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Li Tan, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 130 days.

(21) Appl. No.: 15/736,019

(22) PCT Filed: Nov. 22, 2017

(86) PCT No.: PCT/CN2017/112396
§ 371 (c)(1),
(2) Date: Dec. 13, 2017

(87) PCT Pub. No.: WO2019/085066
PCT Pub. Date: May 9, 2019

(65) Prior Publication Data
US 2019/0130831 A1    May 2, 2019

(30) Foreign Application Priority Data

Oct. 30, 2017 (CN) .......................... 2017 1 1052137

(51) Int. Cl.
| G09G 3/3258 | (2016.01) |
| G06F 1/3206 | (2019.01) |
| H03K 3/02 | (2006.01) |
| H01L 27/32 | (2006.01) |

(52) U.S. Cl.
CPC ......... *G09G 3/3258* (2013.01); *G06F 1/3206* (2013.01); *H01L 27/3244* (2013.01); *H03K 3/02* (2013.01); *H01L 27/3276* (2013.01)

(58) Field of Classification Search
None
See application file for complete search history.

(56) References Cited

U.S. PATENT DOCUMENTS

2017/0011210 A1*  1/2017 Cheong ................ A61B 5/0022

* cited by examiner

*Primary Examiner* — Ifedayo B Iluyomade
(74) *Attorney, Agent, or Firm* — Muncy, Geissler, Olds & Lowe, P.C.

(57) ABSTRACT

The present disclosure provides an AMOLED display device, which comprises a main control processor, a driving integrated chip (IC), a power management chip, and a pulse control line. The power management chip generates a voltage signal, after receiving the digital signal. The power management chip comprises an identification (ID) generation module. The ID generation module comprises a control protocol of the power management chip. The ID generation module is configured to generate an ID signal of the power management chip according to the control protocol of the power management chip.

14 Claims, 5 Drawing Sheets

| PULSE | AVDD | PULSE | AVDD | PULSE | AVDD |
|---|---|---|---|---|---|
| 0 | 5.8V(Default) | 62 | 6.0V | 73 | 7.1V |
| 52 | 5.0V | 63 | 6.1V | 74 | 7.2V |
| 53 | 5.1V | 64 | 6.2V | 75 | 7.3V |
| 54 | 5.2V | 65 | 6.3V | 76 | 7.4V |
| 55 | 5.3V | 66 | 6.4V | 77 | 7.5V |
| 56 | 5.4V | 67 | 6.5V | 78 | 7.6V |
| 57 | 5.5V | 68 | 6.6V | 79 | 7.7V |
| 58 | 5.6V | 69 | 6.7V | | |
| 59 | 5.7V | 70 | 6.8V | | |
| 60 | 5.8V | 71 | 6.9V | | |
| 61 | 5.9V | 72 | 7.0V | | |

FIG. 1A   Prior Art

| PULSE | ELVSS | PULSE | ELVSS | PULSE | ELVSS |
|---|---|---|---|---|---|
| 0 | -4.0V(Default) | 18 | -4.7V | 36 | -2.9V |
| 1 | -6.4V | 19 | -4.6V | 37 | -2.8V |
| 2 | -6.3V | 20 | -4.5V | 38 | -2.7V |
| 3 | -6.2V | 21 | -4.4V | 39 | -2.6V |
| 4 | -6.1V | 22 | -4.3V | 40 | -2.5V |
| 5 | -6.0V | 23 | -4.2V | 41 | -2.4V |
| 6 | -5.9V | 24 | -4.1V | 42 | -2.3V |
| 7 | -5.8V | 25 | -4.0V | 43 | -2.2V |
| 8 | -5.7V | 26 | -3.9V | 44 | -2.1V |
| 9 | -5.6V | 27 | -3.8V | 45 | -2.0V |
| 10 | -5.5V | 28 | -3.7V | 46 | -1.9V |
| 11 | -5.4V | 29 | -3.6V | 47 | -1.8V |
| 12 | -5.3V | 30 | -3.5V | 48 | -1.7V |
| 13 | -5.2V | 31 | -3.4V | 49 | -1.6V |
| 14 | -5.1V | 32 | -3.3V | 50 | -1.5V |
| 15 | -5.0V | 33 | -3.2V | 51 | -1.4V |
| 16 | -4.9V | 34 | -3.1V | | |
| 17 | -4.8V | 35 | -3.0V | | |

FIG. 1B   Prior Art

| Pulse | AVDD | Pulse | AVDD |
|---|---|---|---|
| 42 | 7.9 | 46 | 6.7 |
| 43 | 7.6 | 47 | 6.4 |
| 44 | 7.3 | 48(t) | 6.1 |
| 45 | 7.0 | 49 | 5.8 |

AMOLED DISPLAY DEVICE

BACKGROUND OF DISCLOSURE

Field of Disclosure

The present disclosure relates to the field of display technology, and particularly to an active matrix organic light emitting diode (AMOLED) display device.

Description of Prior Art

With the development of display technology, technologies AMOLED display devices are becoming more and more mature and have been increasingly used in various display fields.

In current AMOLED display devices, power supplies must include three-branch voltages: an analog supply voltage (AVDD), a driving voltage (ELVDD), and a low voltage supply voltage (ELVSS). The AVDD is used for a driving IC to generate a GAMMA voltage and a switching voltage of the thin film transistor. The ELVDD and the ELVSS are driving voltages for lighting the OLED. Stability of these voltages directly affects display performance and service life of the AMOLED display devices.

Conventionally, in the above power supplies, one solution is to provide one power management chip to simultaneously provide three-branch powers: AVDD, ELVDD, and ELVSS. The control method is that a driving IC sends different numbers of pulses to determine a determined voltage value of the power management chip via a pulse control line, settings of the three-branch voltages are from the same signal, and which branch voltage needs to be adjusted is specifically determined by a range of the number of pulses. FIGS. 1 and 2 are two different protocol control tables.

Due to voltage regulation ranges, conflict exists between the two different control tables, and software must be updated when switching the power management chip.

In a first version of the hardware design, an ID identification circuit is needed to pre-match the power management chip. The identification circuit can use two resistors to derive a specific ID voltage with voltage division, and the voltage is provided to the main control processor for distinguishing a range of the control table of the power management chip. In subsequent upgrades, the ID identification circuit will be upgraded together with a new power management chip.

In conventional solutions, an IO resource of the main control processor is occupied. If the main control processor has insufficient AD functions and IO interfaces itself, an AD conversion circuit needs to be added, and the product cost is increased. On the other hand, the identification method of resistor divider also has a chance to cause an ID voltage error in the process of assembling the device on a surface, once the error happens; permanent damage is caused to the AMOLED display device.

SUMMARY OF DISCLOSURE

The objective of the present disclosure is to provide an active matrix organic light-emitting diode (AMOLED) display device, to solve the problem that causing permanent damage to the AMOLED display device when installing an identification (ID) circuit on the printed circuit board In order to achieve the objective, the present disclosure provides a technical solution as follows:

According to one aspect of the present invention, an AMOLED display device is provided. The AMOLED device comprises a main control processor, a driving integrated chip (IC), a power management chip, and a pulse control line.

The main control processor internally stores at least three protocol control tables. The main control processor is configured to send a control signal to the driving IC, to instruct the driving IC to regulate signal voltage of the power management chip.

The driving IC is connected with the power management chip through the pulse control line and configured to send a digital signal to the power management chip, after receiving the control signal sent by the main control processor.

The power management chip generates a voltage signal after receiving the digital signal. The voltage signal comprises a driving voltage of a thin film transistor and a driving voltage of an organic light emitting device.

The power management chip comprises an identification (ID) generation module. The ID generation module comprises a control protocol of the power management chip. The ID generation module is configured to generate an ID signal of the power management chip according to the control protocol of the power management chip.

The control protocol corresponds to a pulse number of the digital signal and a voltage value of the voltage signal.

According to one preferred embodiment, the power management chip further comprises an ID reading pin, a signal-voltage module, and a pulse control pin.

The ID reading pin sends the ID signal generated by the ID generating module to the main control processor or the driving IC.

The pulse control pin is connected with the driving IC via the pulse control line, for receiving the digital signal of the driving IC.

The signal-voltage module converts the digital signal of the driving IC into the voltage signal for output.

According to one preferred embodiment of the disclosure, the AMOLED display device comprises a first ID reading signal line. The driving IC comprises a first ID input interface. The first ID input interface is connected with the ID reading pin via the first ID reading signal line.

According to one preferred embodiment of the disclosure, the driving IC further comprises a first control protocol module for adjusting the control protocol of the power management chip to generate the digital signal according to the ID signal of the power management chip.

According to one preferred embodiment of the disclosure, the AMOLED display device comprises a second ID reading signal line. The main control processor comprises a second ID input interface. The second ID input interface is connected with the ID reading pin via the second ID reading signal line.

According to one preferred embodiment of the disclosure, the main control processor further comprises a second control protocol module for adjusting the control protocol of the power management chip according to the ID signal of the power management chip, and instructing the driving IC to regulate signal voltage of the power management chip.

According to another aspect of the present invention, an AMOLED display device is provided, which is characterize in that the AMOLED device comprises a main control processor, a driving integrated chip (IC), a power management chip, and a pulse control line.

The main control processor internally stores at least three protocol control tables. The main control processor is configured to send a control signal to the driving IC, to instruct the driving IC to regulate signal voltage of the power management chip.

The driving IC is connected with the power management chip through the pulse control line and configured to send a digital signal to the power management chip, after receiving the control signal sent by the main control processor.

The power management chip generates a voltage signal, after receiving the digital signal.

The power management chip comprises a handshake-protocol module. The handshake-protocol module comprises a control protocol of the power management chip. The handshake-protocol module is configured to generate an identification (ID) signal of the power management chip according to the control protocol.

The control protocol corresponds to a pulse number of the digital signal and a voltage value of the voltage signal.

According to one preferred embodiment of the disclosure, the power management chip further comprises a handshake-communication pin. The driving IC comprises a handshake-protocol matched with the handshake-protocol module and a digital input interface. The digital input interface is connected with the handshake-communication pin via the ID reading signal line.

According to still another aspect of the present invention, an AMOLED display device is provided, which is characterize in that the AMOLED device comprises a main control processor, a driving integrated chip (IC), a power management chip, and a pulse control line.

The main control processor internally stores at least three protocol control tables. The main control processor is configured to send a control signal to the driving IC, to instruct the driving IC to regulate signal voltage of the power management chip.

The driving IC is connected with the power management chip through the pulse control line and configured to send a digital signal to the power management chip, after receiving the control signal sent by the main control processor.

The power management chip generates a voltage signal, after receiving the digital signal.

The power management chip comprises an identification (ID) generation module. The ID generation module comprises a control protocol of the power management chip. The ID generation module is configured to generate an ID signal of the power management chip according to the control protocol of the power management chip.

The control protocol corresponds to a pulse number of the digital signal and a voltage value of the voltage signal.

According to one preferred embodiment, the power management chip further comprises an ID reading pin, a signal-voltage module, and a pulse control pin.

The ID reading pin sends the ID signal generated by the ID generating module to the main control processor or the driving IC.

The pulse control pin is connected with the driving IC via the pulse control line, for receiving the digital signal of the driving IC.

The signal-voltage module converts the digital signal of the driving IC into the voltage signal for outputting.

According to one preferred embodiment of the disclosure, the AMOLED display device comprises a first ID reading signal line. The driving IC comprises a first ID input interface. The first ID input interface is connected with the ID reading pin via the first ID reading signal line.

According to one preferred embodiment of the disclosure, the driving IC further comprises a first control protocol module for adjusting the control protocol of the power management chip to generate the digital signal, according to the ID signal of the power management chip.

According to one preferred embodiment of the disclosure, the AMOLED display device comprises a second ID reading signal line. The main control processor comprises a second ID input interface. The second ID input interface is connected with the ID reading pin via the second ID reading signal line.

According to one preferred embodiment of the disclosure, the main control processor further comprises a second control protocol module for adjusting the control protocol of the power management chip according to the ID signal of the power management chip, and instructing the driving IC to regulate signal voltage of the power management chip.

The present disclosure provides an AMOLED display device, which can not only enhance the compatibility of different power management chips, but can also improve the control reliability between the main control processor and the power management chip by disposing the ID part inside the power management chip.

BRIEF DESCRIPTION OF THE DRAWINGS

To describe the technical solutions in the embodiments or in the conventional art more clearly, the following is a brief introduction regarding the accompanying drawings required for describing the embodiments or the conventional art. The accompanying drawings in the following description show merely some embodiments of the present disclosure. For some embodiments, those skilled in the art can obtain other drawings according to the accompanying drawings without creative efforts.

FIGS. 1A and 1B show a part of an AVDD control table and a part of an ELVSS control table of a protocol control table.

DETAILED DESCRIPTION OF PREFERRED EMBODIMENTS

Figures 2, 3:
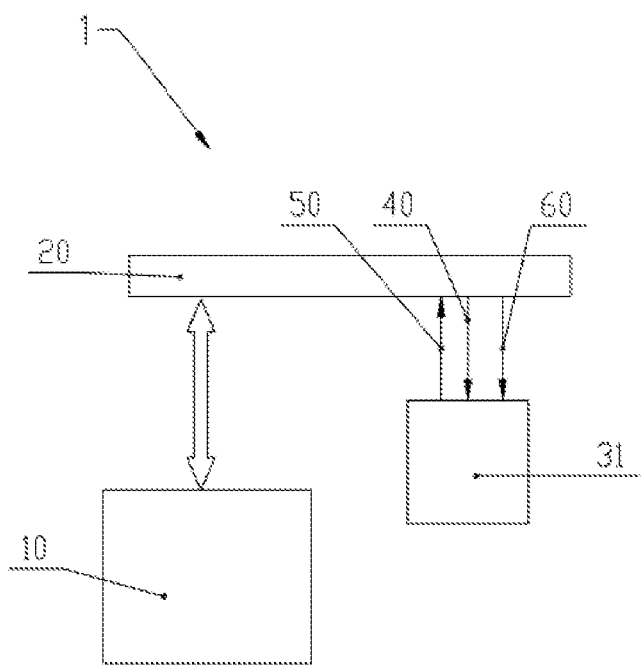
FIG. 2 shows a part of an AVDD control table of another protocol control table.
FIG. 3 is a structural illustrative diagram of an AMOLED display device of an embodiment according to the present disclosure.

The following description of the embodiments is directed to the attached drawings for illustrating specific embodiments in which the disclosure may be practiced. The terms of the present disclosure, such as "up", "down", "front", "post", "left", "right", "inside", "outside", "side", are merely directions referring to the attached drawings. Thus, the directional language used is for the purpose of illustrating and understanding the disclosure and is not intended to be limiting of the disclosure. In the figure, units with similar structures are denoted by the same reference numerals.

In a conventional active matrix organic light-emitting diode (AMOLED) display device the identification (ID) circuit is disposed outside the power management chip, so that the ID circuit may easily have errors while mounted on a printed circuit board and the AMOLED display device may be permanently damaged. The present disclosure proposes an AMOLED display device which can improve the defects.

Figure 4:
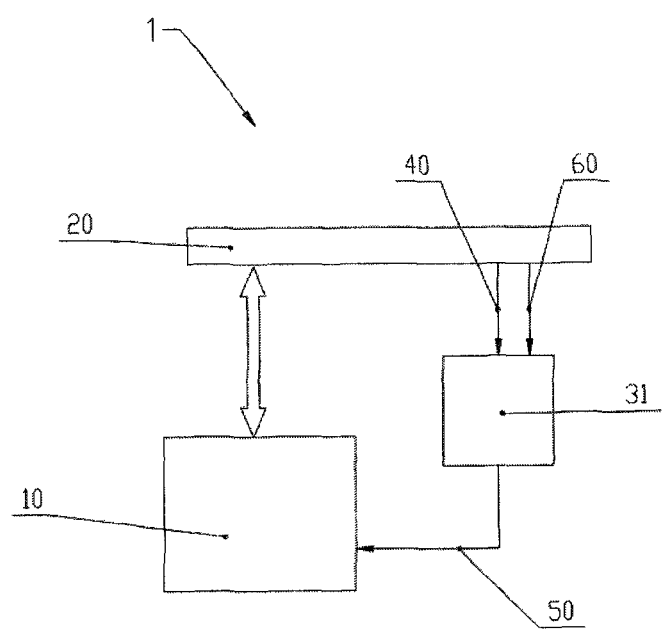
FIG. 4 is another structural illustrative diagram of an AMOLED display device of an embodiment according to the present disclosure.
Figure 5:
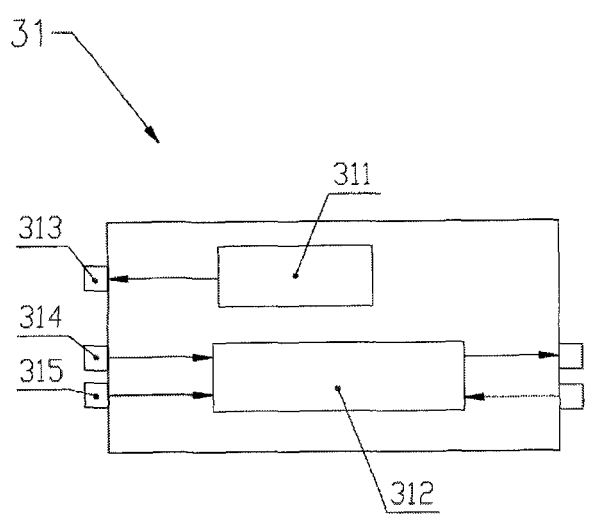
FIG. 5 is a structural illustrative diagram of a power management chip of an embodiment according to the present disclosure.

The present disclosure will be further described below with reference to the accompanying drawings and specific embodiments:

FIGS. 3-4 are structural illustrative diagrams of an AMOLED display device of an embodiment according to the present disclosure. FIG. 5 is a structural illustrative diagram of a power management chip of an embodiment according to the present disclosure.

The present disclosure provides an AMOLED display device 1; the AMOLED device 1 comprises a main control processor 10, a driving integrated chip (IC) 20, a power management chip 31, and a pulse control line 40.

The main control processor 10 internally stores at least three protocol control tables. The main control processor 10 is configured to send a control signal to the driving IC 20 and to instruct the driving IC 20 to regulate signal voltage of the power management chip 31.

The main control processor 10 is equivalent to a "brain" of the AMOLED display device 1, for receiving the feedback information of the various components of the AMOLED display device 1 and then sending instructions to the various components according to the feedback information.

The driving IC 20 is connected with the power management chip 31 through the pulse control line 40 and configured to send a digital signal to the power management chip 31, after receiving the control signal sent by the main control processor 10.

In this stage, the control signal sent from the main control processor 10 to the driving IC 20 may comprise voltage-command signals of AVDD, ELVDD, and ELVSS, or may be switching signals of the power management chip instructed by the driving IC 20.

The power management chip generates a voltage signal after receiving the digital signal. The voltage signal comprises a driving voltage of a thin film transistor and a driving voltage of an organic light emitting device.

In the embodiment, the control protocol of the power management chip 31 is integrated inside the driving IC 20. That is, when the main control processor 10 transmits the three-branch command signals to the driving IC, the control protocol is converted into a pulse signal, then transmitted to the power management chip 31.

In this specification, unless specified otherwise, the control protocol corresponds to a pulse number of the digital signal and a voltage value of the voltage signal.

The power management chip 31 receives the digital signal transmitted by the driving IC 20, and transforms the digital signal to specific AVDD, ELVDD, and ELVSS by a predetermined control protocol, for transmitting to the desired components.

As FIG. 5 shows, the power management chip 31 comprises an ID generation module 311, an ID reading pin 313, a signal-voltage module 312, and a pulse control pin 314.

The ID generation module 311 comprises a control protocol of the power management chip. The ID generation module 311 is configured to generate an ID signal of the power management chip 31 according to the control protocol of the power management chip. The ID signal is an important basis for identifying the control protocol of the power management chip 31. The ID signal may be transmitted to the main control processor 10 or to the driving IC 20 according to specific embodiments.

The ID reading pin 313 sends the ID signal generated by the ID generating module 311 to the main control processor 10 or the driving IC 20.

The pulse control pin 314 is connected with the driving IC 20 via the pulse control line 40, for receiving the digital signal of the driving IC 20. The digital signal is a series of digital signals of different pulse numbers.

The signal-voltage module 312 converts the digital signal of the driving IC 20 into the voltage signal for outputting. The voltage signal comprises AVDD, ELVDD, and ELVSS.

According to one embodiment of the present disclosure, the driving IC 20 comprises a first ID input interface, and the first ID input interface is connected with the ID reading pin 313 through an ID reading signal line 50.

The driving IC 20 further comprises a first control protocol module for adjusting the control protocol of the power management chip 31 to generate the digital signal, according to the ID signal of the power management chip 31.

The first control protocol in the driving IC 20 herein corresponds to the power management chip 31 in the AMOLED display device 1. The function of the first control protocol in the driving IC 20 is to generate a pulse digital signal according to the current control protocol of the power management chip 31, after receiving the instruction from the main control processor 10; in other words, when the power management chip 31 is replaced, the control protocol of the power management chip 31 on the corresponding driving IC 20 also needs to be replaced or upgraded.

According to another embodiment of the present disclosure, the main control processor 10 comprises a second ID input interface which is connected to the ID reading pin via an ID reading signal line 313.

The main control processor 10 comprises a second control protocol module for adjusting the control protocol of the power management chip 31 according to the ID signal of the power management chip 31, and instructing the driving IC 20 to regulate the signal voltage of the power management chip 31, in other words, the ID reading pin 313 on the power management chip 20 is directly connected with the main control processor 10.

The advantage of this is that, while the power management chip 31 is replaced, the driving IC 20 and the main control processor 10 do not need to be changed, with enough protocol control information pre-stored in the software of the main control processor 10. Furthermore, when switching the driving IC 20, there is no need to upgrade the software, but an I/O port with DA function on the main control processor 10 is reserved for connecting with the ID reading pin 313.

The voltage signal generated by the power management chip 31 comprises a first voltage signal, a second voltage signal, and a third voltage signal. The first signal voltage is AVDD, the second voltage signal is ELVDD, and the third voltage signal is ELVSS.

The voltage corresponding to AVDD is a switch voltage of a thin film transistor, and the voltages corresponding to ELVDD and ELVSS are driving voltages of all organic light emitting component.

The AMOLED display device 1 further comprises an enabling pin 315. The enabling pin 315 is connected with the driving IC 20 for controlling the power management chip 31 to be turned on and off.

Figure 6:
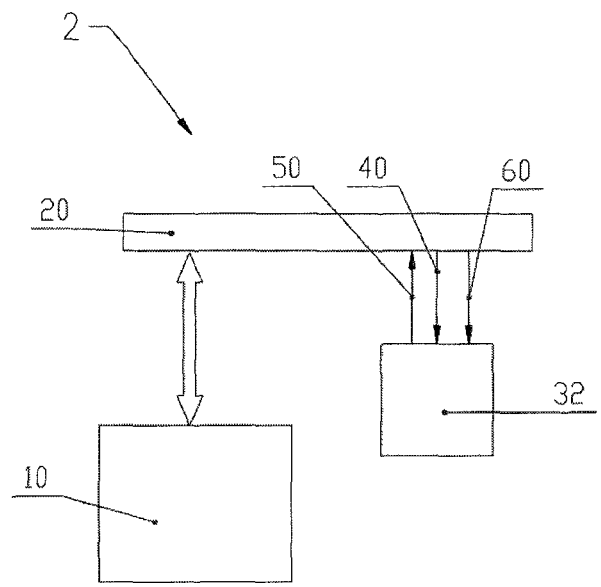
FIG. 6 is a structural illustrative diagram of an AMOLED display device of another embodiment according to the present disclosure.
Figure 7:
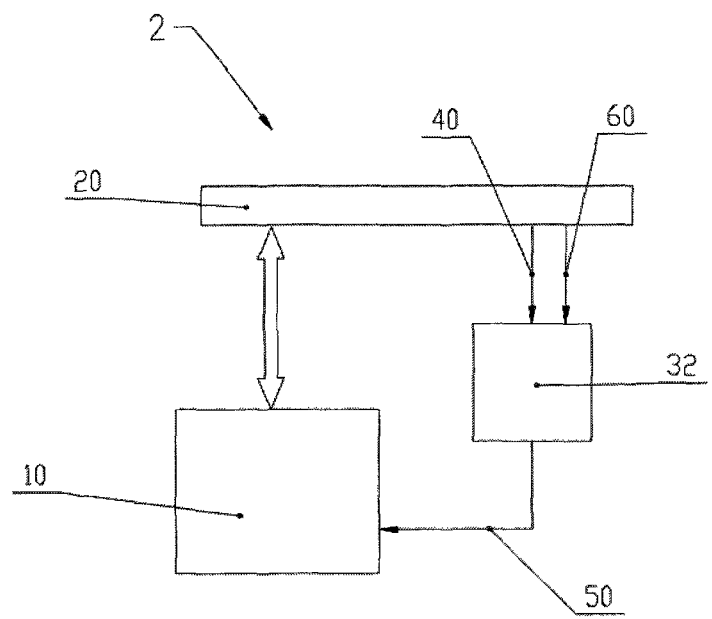
FIG. 7 is another structural illustrative diagram of an AMOLED display device of another embodiment according to the present disclosure.
Figure 8:
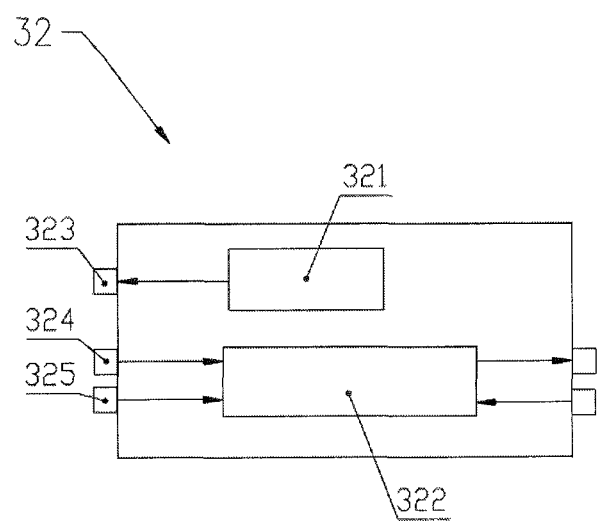
FIG. 8 is a structural illustrative diagram of a power management chip of another embodiment according to the present disclosure.

FIGS. 6-7 are structural illustrative diagrams of an AMOLED display device of another embodiment according to the present disclosure. FIG. 8 is a structural illustrative diagram of a power management chip of another embodiment according to the present disclosure.

The present disclosure provides an AMOLED display device 2; the AMOLED device 2 comprises a main control processor 10, a driving IC 20, a power management chip 32, and a pulse control line 40.

The main control processor 10 internally stores at least three protocol control tables. The main control processor 10 is configured to send a control signal to the driving IC 20, to instruct the driving IC 20 to regulate signal voltage of the power management chip 31.

The driving IC 20 is connected with the power management chip 32 through the pulse control line 40 and configured to send a digital signal to the power management chip 32, after receiving the control signal sent by the main control processor 10.

The power management chip 32 comprises a handshake-protocol module 321, a handshake-communication pin 323, a signal-voltage module 322, and a pulse control pin 324.

The handshake-protocol module 321 is configured to generate an ID signal of the power management chip 32.

The handshake-communication pin 323 is configured to transmit the ID signal generated by the handshake-protocol module 321 to the main control processor 10 or the driving IC 20.

The pulse control pin 324 is connected with the pulse control line 40 for receiving the digital signal from the driving IC 20.

The signal-voltage module 322 is configured to convert the digital signal of the driving IC 20 into a voltage signal for output.

The difference between the AMOLED display device 2 and the AMOLED display device 1 is that the ID generation module 311 is replaced by the handshake-protocol module 321 so as to convert the ID signal from a simple analog voltage to a replicated digital signal so as to improve the handshaking reliability, and at the same time, the control ability of the power management chip 1 will be stronger to improve the safety of the AMOLED display device 1.

In the AMOLED display device 2, it is necessary to convert the ID input interface in the AMOLED display device 1 into a digital ID interface and pre-write the corresponding handshake protocol.

Besides the above differences, the principle of the AMOLED display device 2 in this embodiment is consistent with the principle of the AMOLED display device 1 described above. Reference may specifically be made to the principle of the AMOLED display device 1 in the above preferred embodiments, and details are not described again herein.

The present disclosure provides an AMOLED display device, which can not only enhance the compatibility of different power management chips, but also improve the control reliability between the main control processor and the power management chip by disposing the ID part inside the power management chip.

Although the present disclosure is disclosed as preferred embodiments, the foregoing preferred embodiments are not intended to limit the present disclosure. Those of ordinary skill in the art, without departing from the spirit and scope of the present disclosure, can make various kinds of modifications and variations to the present disclosure. Therefore, the scope of the claims of the present disclosure must be defined.

What is claimed is:

1. An active matrix organic light-emitting diode (AMOLED) display device, comprising: a main control processor, a driving integrated chip (IC), a power management chip, and a pulse control line;

the main control processor internally storing at least three protocol control tables, the main control processor configured to send a control signal to the driving IC, to instruct the driving IC to regulate signal voltage of the power management chip;

the driving IC is connected with the power management chip through the pulse control line and configured to send a digital signal to the power management chip after receiving the control signal sent by the main control processor;

the power management chip generating a voltage signal after receiving the digital signal, the voltage signal comprising a driving voltage of a thin film transistor and a driving voltage of an organic light emitting device;

the power management chip comprising an identification (ID) generation module, the ID generation module comprising a control protocol of the power management chip, and the ID generation module configured to generate an ID signal of the power management chip according to the control protocol of the power management chip;

wherein the control protocol corresponds to a pulse number of the digital signal and a voltage value of the voltage signal.

2. The AMOLED display device according to claim 1, wherein the power management chip further comprises an ID reading pin, a signal-voltage module, and a pulse control pin;

the ID reading pin sending the ID signal generated by the ID generating module to the main control processor or the driving IC;

the pulse control pin is connected with the driving IC via the pulse control line for receiving the digital signal of the driving IC;

the signal-voltage module converting the digital signal of the driving IC into the voltage signal for outputting.

3. The AMOLED display device according to claim 2, wherein the AMOLED display device comprises a first ID reading signal line, and the driving IC comprises a first ID input interface, the first ID input interface is connected with the ID reading pin via the first ID reading signal line.

4. The AMOLED display device according to claim 3, wherein the driving IC further comprises a first control protocol module for adjusting the control protocol of the power management chip to generate the digital signal, according to the ID signal of the power management chip.

5. The AMOLED display device according to claim 2, wherein the AMOLED display device comprises a second ID reading signal line, and the main control processor comprises a second ID input interface, the second ID input interface is connected with the ID reading pin via the second ID reading signal line.

6. The AMOLED display device according to claim 5, wherein the main control processor further comprises a second control protocol module for adjusting the control protocol of the power management chip according to the ID signal of the power management chip, and instructing the driving IC to regulate signal voltage of the power management chip.

7. An active matrix organic light-emitting diode (AMOLED) display device, comprising: a main control processor, a driving integrated chip (IC), a power management chip, and a pulse control line;
the main control processor internally storing at least three protocol control tables, the main control processor configured to send a control signal to the driving IC, to instruct the driving IC to regulate signal voltage of the power management chip;
the driving IC is connected with the power management chip through the pulse control line and configured to send a digital signal to the power management chip after receiving the control signal sent by the main control processor;
the power management chip generating a voltage signal after receiving the digital signal;
the power management chip comprising a handshake-protocol module; the handshake-protocol module comprising a control protocol of the power management chip, the handshake-protocol module configured to generate an identification (ID) signal of the power management chip according to the control protocol;
wherein the control protocol corresponds to a pulse number of the digital signal and a voltage value of the voltage signal.

8. The AMOLED display device according to claim 7, wherein the power management chip further comprises a handshake-communication pin, the driving IC comprises a handshake-protocol matched with the handshake-protocol module and a digital input interface, the digital input interface is connected with the handshake-communication pin via the ID reading signal line.

9. An active matrix organic light-emitting diode (AMOLED) display device, comprising: a main control processor, a driving integrated chip (IC), a power management chip, and a pulse control line;
the main control processor internally storing at least three protocol control tables, the main control processor configured to send a control signal to the driving IC and to instruct the driving IC to regulate signal voltage of the power management chip;
the driving IC, connected with the power management chip through the pulse control line and configured to send a digital signal to the power management chip after receiving the control signal sent by the main control processor;
the power management chip generating a voltage signal after receiving the digital signal;
the power management chip comprising an identification (ID) generation module, the ID generation module comprising a control protocol of the power management chip, and the ID generation module configured to generate an ID signal of the power management chip according to the control protocol of the power management chip;
wherein the control protocol corresponds to a pulse number of the digital signal and a voltage value of the voltage signal.

10. The AMOLED display device according to claim 9, wherein the power management chip further comprises an ID reading pin, a signal-voltage module, and a pulse control pin;
the ID reading pin sending the ID signal generated by the ID generating module to the main control processor or the driving IC;
the pulse control pin is connected with the driving IC via the pulse control line for receiving the digital signal of the driving IC;
the signal-voltage module converting the digital signal of the driving IC into the voltage signal for outputting.

11. The AMOLED display device according to claim 10, wherein the AMOLED display device comprises a first ID reading signal line, and the driving IC comprises a first ID input interface, the first ID input interface is connected with the ID reading pin via the first ID reading signal line.

12. The AMOLED display device according to claim 11, wherein the driving IC further comprises a first control protocol module for adjusting the control protocol of the power management chip to generate the digital signal, according to the ID signal of the power management chip.

13. The AMOLED display device according to claim 10, wherein the AMOLED display device comprises a second ID reading signal line, and the main control processor comprises a second ID input interface, the second ID input interface is connected with the ID reading pin via the second ID reading signal line.

14. The AMOLED display device according to claim 13, wherein the main control processor further comprises a second control protocol module for adjusting the control protocol of the power management chip according to the ID signal of the power management chip, and instructing the driving IC to regulate signal voltage of the power management chip.

* * * * *